United States Patent
Bauer et al.

(10) Patent No.: US 9,659,927 B2
(45) Date of Patent: May 23, 2017

(54) JUNCTION BARRIER SCHOTTKY RECTIFIER

(71) Applicant: ABB Schweiz AG, Baden (CH)

(72) Inventors: Friedhelm Bauer, Semione (CH); Andrei Mihaila, Baden (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 14/971,206

(22) Filed: Dec. 16, 2015

(65) Prior Publication Data

US 2016/0190126 A1 Jun. 30, 2016

(30) Foreign Application Priority Data

Dec. 24, 2014 (EP) .................................. 14200282

(51) Int. Cl.
*H01L 29/00* (2006.01)
*H01L 27/08* (2006.01)
(Continued)

(52) U.S. Cl.
CPC ...... *H01L 27/0814* (2013.01); *H01L 29/0619* (2013.01); *H01L 29/0688* (2013.01);
(Continued)

(58) Field of Classification Search
CPC ............. H01L 29/0619; H01L 29/0688; H01L 29/1095; H01L 29/1608; H01L 29/36; H01L 29/6606; H01L 29/872
See application file for complete search history.

(56) References Cited

U.S. PATENT DOCUMENTS

| 4,982,260 A | * | 1/1991 | Chang | .................. | H01L 29/861 |
| | | | | | 257/476 |
| 5,101,244 A | * | 3/1992 | Mori | ....................... | H01L 24/03 |
| | | | | | 257/260 |

(Continued)

FOREIGN PATENT DOCUMENTS

| JP | H07226521 A | 8/1995 |
| JP | 2011233614 A | 11/2011 |
| JP | 2014060460 A | 4/2014 |

OTHER PUBLICATIONS

European Search Report, Application No. 14 20 0282, Completed: Jun. 1, 2015, 5 pages.

*Primary Examiner* — John C Ingham
*Assistant Examiner* — Ismail Muse
(74) *Attorney, Agent, or Firm* — Whitmyer IP Group LLC (57) ABSTRACT

A junction barrier Schottky rectifier with first and second drift layer sections, wherein a peak net doping concentration of the first section is at least two times lower than a minimum net doping concentration of the second section. For each emitter region the first section includes a layer which is in contact with the respective emitter region to form a pn-junction between the first section and the respective emitter region, wherein the thickness of this layer in a direction perpendicular to the interface between the first section and the respective emitter region is at least 0.1 μm. The JBS rectifier has a transition from unipolar to bipolar conduction mode at a lower forward bias due to lowering of electrostatic forces otherwise impairing the transport of electrons toward the emitter regions under forward bias conditions, and with reduced snap-back phenomenon.

18 Claims, 8 Drawing Sheets

(51) Int. Cl.
*H01L 29/36* (2006.01)
*H01L 29/872* (2006.01)
*H01L 29/06* (2006.01)
*H01L 29/10* (2006.01)
*H01L 29/66* (2006.01)
*H01L 29/16* (2006.01)

(52) U.S. Cl.
CPC .......... *H01L 29/1095* (2013.01); *H01L 29/36* (2013.01); *H01L 29/872* (2013.01); *H01L 29/0649* (2013.01); *H01L 29/1608* (2013.01); *H01L 29/6606* (2013.01)

(56) References Cited

U.S. PATENT DOCUMENTS

| | | | | |
|---|---|---|---|---|
| 5,241,195 A * | 8/1993 | Tu | H01L 27/0788 | 257/155 |
| 5,371,400 A * | 12/1994 | Sakurai | H01L 29/0619 | 257/478 |
| 6,710,419 B2 * | 3/2004 | Buchanan | H01L 29/0619 | 257/475 |
| 6,975,013 B2 * | 12/2005 | Fujihira | H01L 29/0692 | 257/471 |
| 7,112,865 B2 * | 9/2006 | Fujihira | H01L 29/0692 | 257/104 |
| 2002/0125482 A1 * | 9/2002 | Friedrichs | H01L 21/0485 | 257/73 |
| 2003/0020135 A1 * | 1/2003 | Kaminski | H01L 29/47 | 257/484 |
| 2006/0022292 A1 | 2/2006 | Shenoy | | |
| 2006/0220166 A1 * | 10/2006 | Kikuchi | H01L 29/872 | 257/481 |
| 2006/0255423 A1 * | 11/2006 | Ryu | H01L 29/872 | 257/485 |
| 2008/0277668 A1 * | 11/2008 | Okuno | H01L 29/0692 | 257/77 |
| 2009/0160008 A1 * | 6/2009 | Fujiwara | H01L 29/872 | 257/471 |
| 2010/0032730 A1 * | 2/2010 | Endo | H01L 29/456 | 257/280 |
| 2012/0211768 A1 * | 8/2012 | Yoshikawa | H01L 29/0653 | 257/77 |
| 2012/0267748 A1 | 10/2012 | Suzuki | | |
| 2013/0140585 A1 * | 6/2013 | Mazzola | H01L 29/872 | 257/77 |
| 2016/0005884 A1 * | 1/2016 | Aketa | H01L 29/6606 | 257/43 |

* cited by examiner

JUNCTION BARRIER SCHOTTKY RECTIFIER

FIELD OF THE INVENTION

The present invention relates to a junction barrier Schottky (JBS) rectifier.

BACKGROUND OF THE INVENTION

From US 2006/022292 A1 there is known a junction barrier Schottky (JBS) diode which has a substrate and two or more epitaxial layers, including at least a thin, lightly doped N-type top epitaxial layer, and an N-type epitaxial layer on which the topmost epitaxial layer is disposed. Multiple epitaxial layers support the blocking voltage of the diode, and each of the multiple epitaxial layers supports a substantial portion of the blocking voltage. Optimization of the thickness and dopant concentrations of at least the top two epitaxial layers results in reduced capacitance and switching losses, while keeping effects on forward voltage and on-resistance low.

From US 2009/160008 A1 there are known a semiconductor device that includes an n-type semiconductor substrate and an upper electrode formed on an upper face of the semiconductor substrate and a method of manufacturing the semiconductor device. A p-type semiconductor region is repeatedly formed in the semiconductor substrate in at least one direction parallel to the substrate plane so as to be exposed on an upper face of the semiconductor substrate. The upper electrode includes a metal electrode portion; and a semiconductor electrode portion made of a semiconductor material whose band gap is narrower than that of the semiconductor substrate. The semiconductor electrode portion is provided on each p-type semiconductor region exposed on the upper face of the semiconductor substrate. The metal electrode portion is in Schottky contact with an n-type semiconductor region exposed on the upper face of the semiconductor substrate, and is in ohmic contact with the semiconductor electrode portion.

From JP H07 2265521 A there is known a junction barrier Schottky (JBS) diode with two section emitter regions. The two sections of the emitter regions have different doping concentrations.

A junction barrier Schottky (JBS) rectifier is a hybrid power device, which combines a Schottky and pin diode structure in one device, making use of the advantages of both structures. It has a low on-state resistance and a high blocking capability. Silicon carbide (SiC) based JBS rectifiers are candidates to replace silicon (Si) based pin diodes for high blocking voltages. SiC material properties allow devices with higher voltage rating and higher operating temperatures compared to Si.

Figure 1:
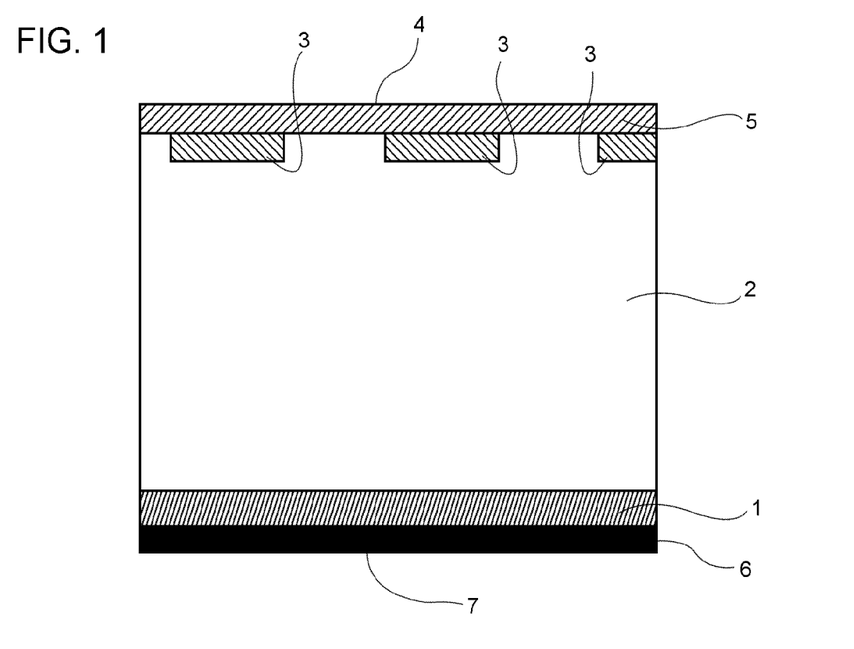
FIG. 1 shows a partial cross-sectional view of a common junction barrier Schottky (JBS) rectifier.

A common SiC based JBS rectifier is shown in FIG. 1. It comprises a substrate layer 1, which is made of highly doped n-type silicon carbide. A low-doped n-type silicon carbide layer, which is the drift layer 2 of the device, is formed on the substrate layer 1. Adjacent to the surface of the drift layer on a first main side 4 of the JBS rectifier opposite to the substrate layer 1 there are formed a plurality of p-type emitter regions 3. The first main side 4 of the JBS rectifier, which is the anode side of the device, is covered with a first metal contact layer 5 that forms a Schottky barrier in places where the first metal contact layer 5 contacts the n-type drift layer 2 and that forms an ohmic contact with the p-type emitter regions 3 in places where the first metal contact layer 5 contacts the p-type emitter regions 3. Typically the drift layer 2 is grown epitaxially on a highly doped n-type SiC substrate wafer used as the substrate layer 1.

Depending on the electrical polarity of the voltage between anode and cathode, the Schottky contact either blocks current flow or allows the passage of majority carriers (electrons in n-doped semiconductor material). These two modes correspond with the blocking and on-state operation of the JBS rectifier under normal operating conditions.

The blocking capability of the JBS rectifier is mainly given by the thickness and doping density of the n-doped drift layer. However, as a result of the nature of the Schottky contact, image force lowering at elevated electric field levels at high blocking voltages causes the barrier for electrons to shrink. A pure Schottky barrier diode without p-doped regions will be prone to increasing levels of leakage currents at high reverse bias. The comparatively large number of carriers will entail intensified pair generation during impact ionization. As a result, pure Schottky barrier diodes exhibit a relatively high leakage current and low breakdown voltage. In a JBS rectifier, the p-type emitter regions help to improve this situation. Under reverse bias, a depletion layer develops across the pn-junctions between the p-type emitter regions 3 and the n-type drift layer 2 in the same way as it does in a pin diode. The individual depletion zones around the p-doped emitter regions 3 may eventually connect with each other and close in between two adjacent emitter regions 3 below the Schottky contact. In this way the Schottky contact is effectively protected from a high electric field peak. The combination of Schottky contacts with p-doped emitter regions 3 will therefore reduce leakage currents and allow to reach much higher breakdown voltages compared to pure Schottky barrier diodes.

Given the large on-state voltage drop of unipolar power devices it is also a most important requirement for JBS rectifiers that they can properly handle surge current conditions. In such a failure mode operation, the forward current density in the JBS rectifier can increase up to 1000 $A/cm^2$ to 2000 $A/cm^2$ (that is about 10 to 20 times the on-state current density in normal operation). Due to excessive power loss generation this level cannot be handled without failure by the Schottky diode part alone. At this point, the pin diode sections in the JBS rectifier start to conduct when the forward bias exceeds about 3 V to 4 V. The bipolar regime involves the generation of a carrier plasma consisting of electrons and holes. The pin diode part in the JBS rectifier help to safely handle surge current situations without exceeding thermal limits of the device. Achieving this goal imposes additional, different requirements on the p-doped emitter regions 3 at the JBS anode surface. Controlling the surface field at the Schottky contact to increase the breakdown voltage can be achieved with relatively narrow p-doped emitter regions 3, whereas separations exceeding several microns would compromise the breakdown voltage. The requirement to handle surge current situations calls for strong bipolar emitter action of the p-doped emitter regions 3. The simplest way to satisfy this request is a wide and highly p-doped emitter region 3. Unfortunately, such wide emitter region 3 reduces the anode area available for Schottky contacts and thus leads to higher on-state resistance.

In FIGS. 5 to 10 there are shown current voltage characteristics for different JBS rectifiers. The curves referenced as "conventional drift layer" are the forward current voltage characteristics of common JBS rectifiers as discussed above with different doping concentrations in the p-type emitter regions 3 and with different widths of the emitter regions 3.

Figure 5:
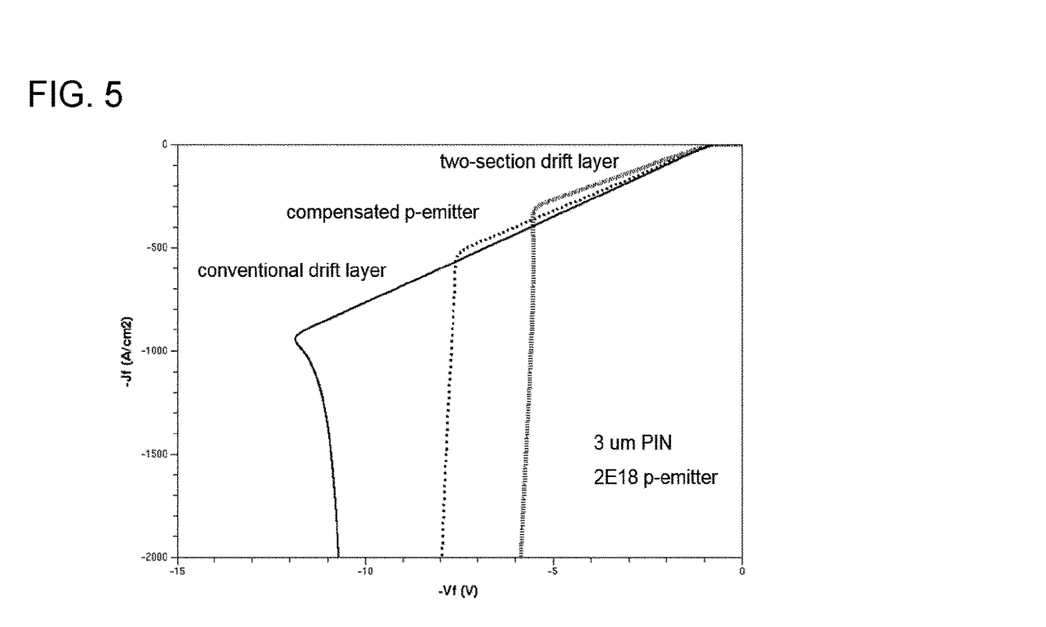
FIG. 5 shows current voltage characteristics of the JBS rectifier according to the first comparative example, the JBS rectifier according to the second comparative example and the common JBS rectifier as shown in FIG. 1, wherein the width of the emitter regions is 6 µm and the doping concentration in the emitter regions is $2 \cdot 10^{18}$ cm$^{-3}$, respectively.
Figure 6:
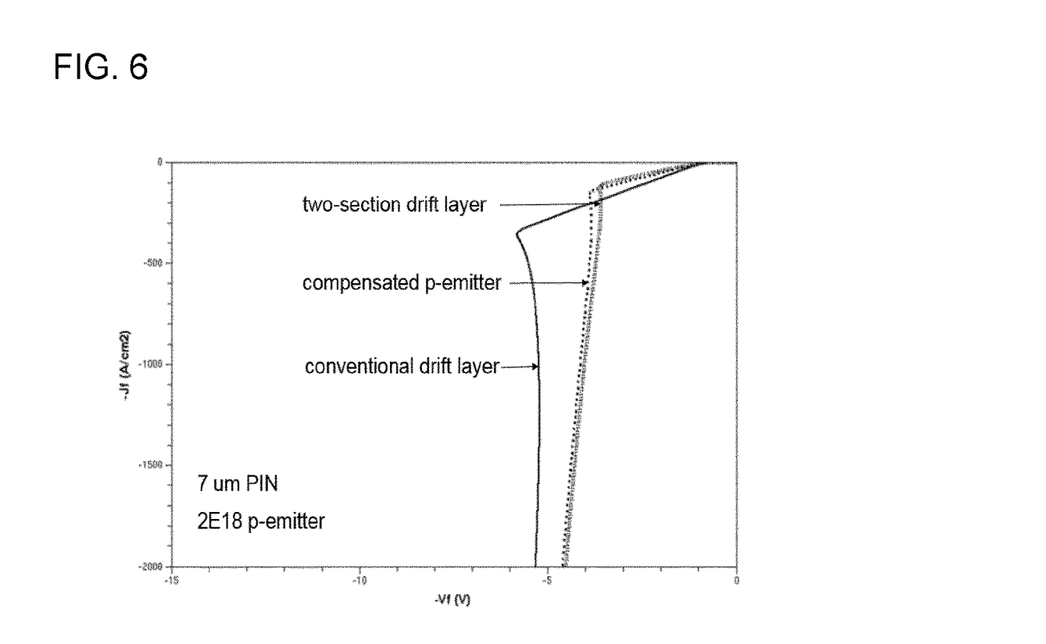
FIG. 6 shows current voltage characteristics of the JBS rectifier according to the first comparative example, the JBS rectifier according to the second comparative example and the common JBS rectifier as shown in FIG. 1, wherein the width of the emitter regions is 14 µm and the doping concentration in the emitter regions is $2 \cdot 10^{18}$ cm$^{-3}$, respectively.
Figure 7:
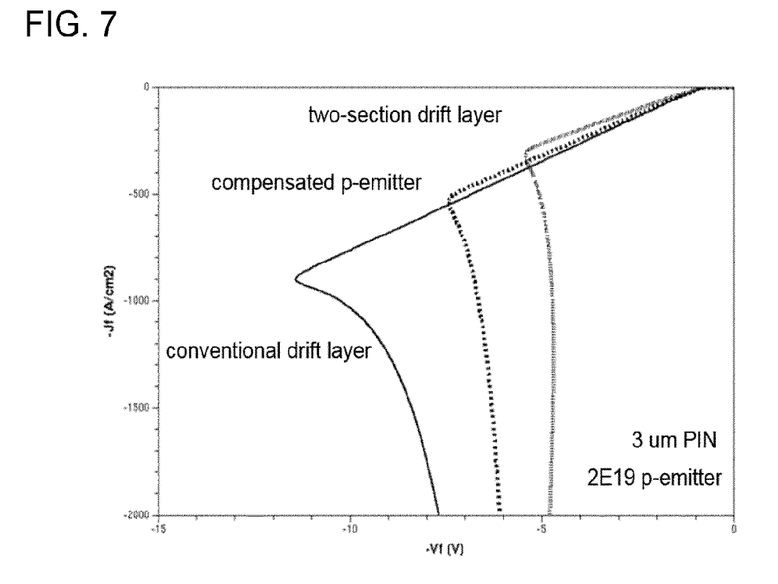
FIG. 7 shows current voltage characteristics of the JBS rectifier according to the first comparative example, the JBS rectifier according to the second comparative example and the common JBS rectifier as shown in FIG. 1, wherein the width of the emitter regions is 6 µm and the doping concentration in the emitter regions is $2 \cdot 10^{19}$ cm$^{-3}$, respectively.
Figure 8:
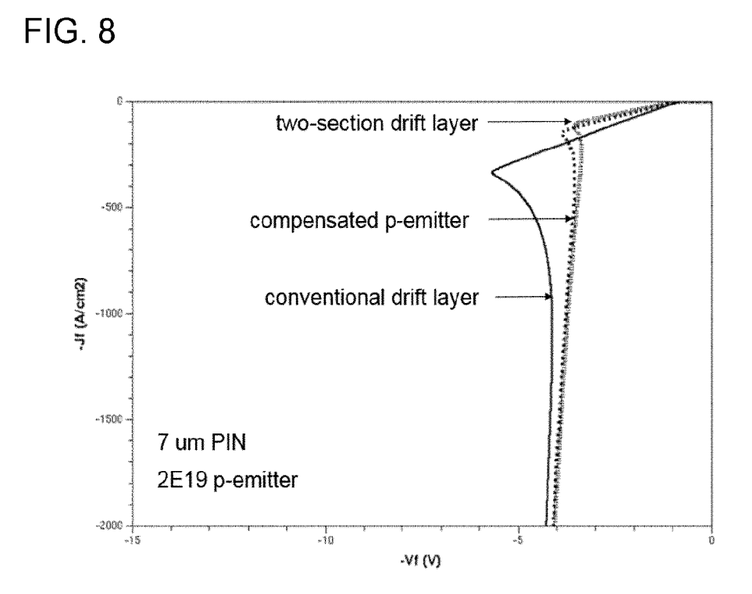
FIG. 8 shows current voltage characteristics of the JBS rectifier according to the first comparative example, the JBS rectifier according to the second comparative example and the common JBS rectifier as shown in FIG. 1, wherein the width of the emitter regions is 14 µm and the doping concentration in the emitter regions is $2 \cdot 10^{19}$ cm$^{-3}$, respectively.
Figure 9:
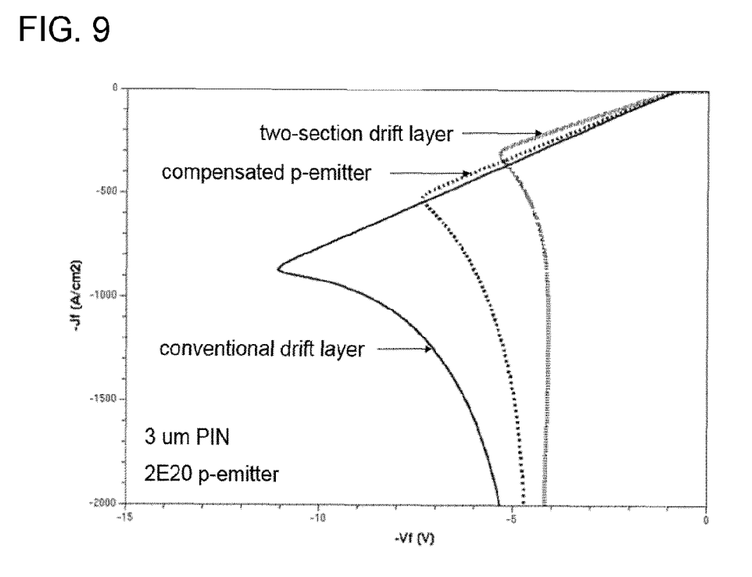
FIG. 9 shows current voltage characteristics of the JBS rectifier according to the first comparative example, the JBS rectifier according to the second comparative example and the common JBS rectifier as shown in FIG. 1, wherein the width of the emitter regions is 6 µm and the doping concentration in the emitter regions is $2 \cdot 10^{20}$ cm$^{-3}$, respectively.
Figure 10:
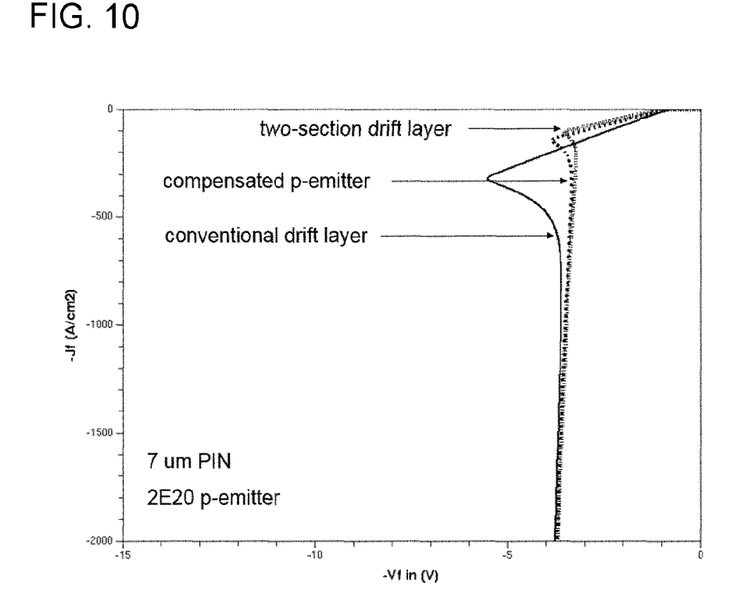
FIG. 10 shows current voltage characteristics of the JBS rectifier according to the first comparative example, the JBS rectifier according to the second comparative example and the common JBS rectifier as shown in FIG. 1, wherein the width of the emitter regions is 14 µm and the doping concentration in the emitter regions is $2 \cdot 10^{20}$ cm$^{-3}$, respectively.

In FIG. 5 the width of the emitter regions is 6 µm and the doping concentration of the emitter regions is $2 \cdot 10^{18}$ cm$^{-3}$.
In FIG. 6 the width of the emitter regions is 14 µm and the doping concentration in the emitter regions is $2 \cdot 10^{18}$ cm$^{-3}$.
In FIG. 7 the width of the emitter regions is 6 µm and the doping concentration in the emitter regions is $2 \cdot 10^{19}$ cm$^{-3}$.
In FIG. 8 the width of the emitter regions is 14 µm and the doping concentration in the emitter regions is $2 \cdot 10^{19}$ cm$^{-3}$.
In FIG. 9 the width of the emitter regions is 6 µm and the doping concentration in the emitter regions is $2 \cdot 10^{20}$ cm$^{-3}$.
In FIG. 10 the width of the emitter regions is 14 µm and the doping concentration in the emitter regions is $2 \cdot 10^{20}$ cm$^{-3}$.

As can be seen from FIGS. 5 to 10, all common JBS rectifiers show at low forward currents a region with positive differential resistance in which the current is mainly carried through the Schottky barrier diode parts (unipolar conduction mode). At higher forward currents the current is carried mainly through the pin diode parts (bipolar conduction mode). In the transition from the unipolar conduction mode to the bipolar conduction mode the current voltage characteristics exhibit a region with a negative differential resistance. This transition is known for narrow shorted p-emitters, for example for emitter-shorted insulated gate bipolar transistors (IGBTs) as snap-back phenomenon during turning on of the device.

To increase life-time and robustness of the JBS rectifiers under surge current conditions no or minimal snap-back phenomenon and a transition from unipolar to bipolar conduction mode at a forward bias as low as possible would be preferable.

SUMMARY OF THE INVENTION

In view of the above it is the object of the present invention to provide a JBS rectifier with improved capabilities to handle surge currents. In particular it is the object of the invention to provide a JBS rectifier with no or minimal snap-back phenomenon and a transition from unipolar to bipolar conduction mode at a low forward bias.

The object is attained by a JBS rectifier according to the claimed invention. Further developments of the invention are specified in the dependent claims.

In the junction barrier Schottky rectifier according to the claimed invention, the use of a drift layer having a first and a second drift layer section, wherein a peak net doping concentration of the first drift layer section is at least two times lower than a minimum net doping concentration of the second drift layer section and wherein the first drift layer section is in contact with each one of the emitter regions, results in a transition from unipolar to bipolar conduction mode at lower forward bias due to lowering of electrostatic forces otherwise impairing the transport of electrons toward the emitter regions under forward bias conditions. At the same time the two section drift layer can minimize the snap-back phenomenon in the JBS rectifier.

In an exemplary embodiment the first drift layer section forms the Schottky contact with the metal contact layer and separates the first metal contact layer from the second drift layer section. In this exemplary embodiment, the width of the depletion zone of the pn-junction between the drift layer and the emitter region for a given reverse bias is increased in a region adjacent to the Schottky contact. Accordingly, the Schottky contact can be more effectively protected from a high electric field peak. This allows to reduce leakage currents.

In an exemplary embodiment the first metal contact layer extends into a groove or hole formed in each one of the emitter regions. In this exemplary embodiment, the emitter characteristics are improved.

In the device according to the claimed invention, each one of the emitter regions comprises a first emitter section and a second emitter section, wherein a peak net doping concentration of the second emitter region is at least two times higher than a peak net doping concentration of the first emitter section. With such configuration the blocking characteristics can be improved without impairing the on-state characteristics. In particular, the breakdown voltage can be increased and the leakage current can be decreased. Best blocking characteristics can be obtained in a configuration in which a lateral side of the first emitter section in each emitter region is covered by the second emitter section. In each emitter region the second emitter section may be separated from the first metal contact layer by an oxide layer formed on the second emitter section to improve emitter injection efficiency at the emitter edge regions.

In the device according to the claimed invention, in each emitter region the second emitter section extends to the second drift layer section, while the first emitter section is separated from the second drift layer section by the first drift layer section. With the configuration of the claimed invention, the Schottky contact is protected particularly effectively from a high electric field peak.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention.

DETAILED DESCRIPTION OF THE INVENTION

In the following there are described a first to eighth comparative example and an embodiment of the claimed invention. The comparative examples do as such not fall within the scope of the claims but serve for a better understanding of the claimed invention.

Figure 2:
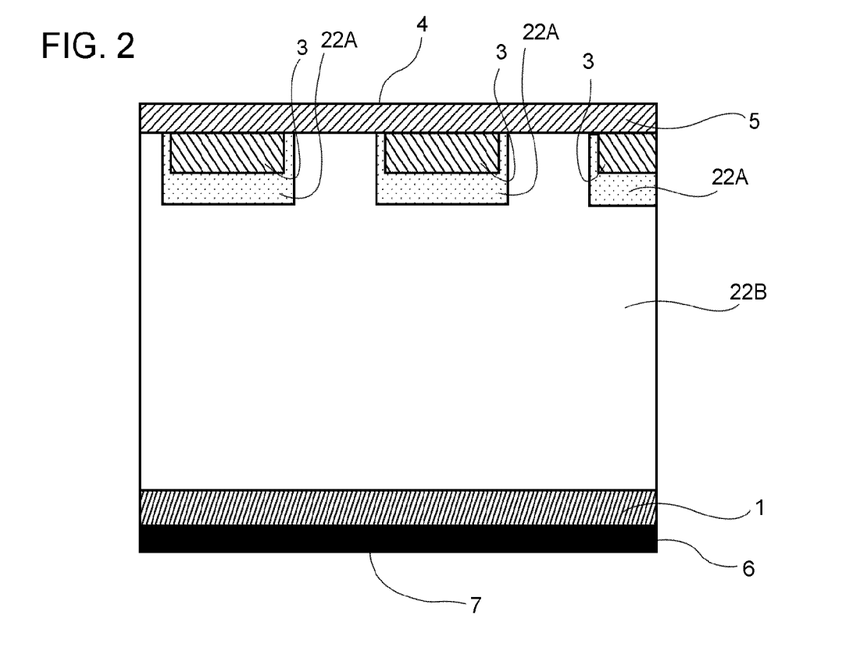
FIG. 2 shows a partial cross-sectional view of a JBS rectifier according to a first comparative example.

FIG. 2 shows a JBS rectifier according to a first comparative example. It comprises a substrate layer 1, which is made of highly doped n-type silicon carbide. A low-doped n-type silicon carbide layer, which is the drift layer of the device, is formed on the substrate layer 1. The drift layer comprises a first drift layer section 22A and a second drift layer section 22B. The net doping concentration of the substrate layer is higher than the net doping concentration of the drift layer to allow formation of an ohmic contact on the substrate layer. The net doping concentration of the drift layer is exemplarily in a range from $1.0 \cdot 10^{12}$ cm$^{-3}$ to $1.0 \cdot 10^{17}$ cm$^{-3}$, exemplarily in a range from $1.0 \cdot 10^{13}$ cm$^{-3}$ to $1.0 \cdot 10^{16}$ cm$^{-3}$, or exemplarily in a range from $1.0 \cdot 10^{14}$ cm$^{-3}$ to $1.0 \cdot 10^{16}$ cm$^{-3}$. The peak net doping concentration $n_{max}(1)$ in the first drift layer section 22A is exemplarily $1 \cdot 10^{16}$ cm$^{-3}$ or below, exemplarily $5 \cdot 10^{15}$ cm$^{-3}$ or below, or exemplarily $1 \cdot 10^{15}$ cm$^{-3}$ or below.

The peak net doping concentration $n_{max}(1)$, i.e. the maximum doping concentration of the first drift layer section 22A, is at least two times, exemplarily at least 3 times lower, or exemplarily at least 4 times lower than a minimum net doping concentration $n_{min}(2)$ of the second drift layer section 22B. Exemplarily, the doping concentration throughout the second drift layer section 22B is substantially constant. A doping profile is still considered constant in case of variations of up to 10% from the average doping concentration. At a boundary between the first drift layer section 22A and the second drift layer section 22B, the net doping concentration has a step-like profile to increase from the net doping concentration in the first drift layer section 22A to the net doping concentration in the second drift layer section 22B. The profile of the net doping concentration is considered to be step-like if the net doping concentration increases from the net doping concentration in the first drift layer section 22A to the net doping concentration in the second drift layer section 22B in a thin transition region connecting the first drift layer section 22A and the second drift layer section 22B with a steep gradient dn/dx of at least $20 \cdot n_{max}(1)/\mu m$, exemplarily of at least $40 \cdot n_{max}(1)/\mu m$.

Adjacent to the surface of the drift layer 22A, 22B on a first main side 4 of the JBS rectifier opposite to the substrate layer 1 there are formed a plurality of p-type emitter regions 3. Each of the p-type emitter region 3 is formed as a strip. Throughout the specifications, strips shall be understood as layers, which have in one direction, which is their longitudinal direction, a longer extension than in the other directions by having two longer sides, which are typically arranged parallel to each other. In FIG. 2 there can be seen a cross-section vertical to the longitudinal axis of three strip-shaped emitter regions 3 adjacent to each other. The emitter region 3 on the outermost right side in FIG. 2 is shown only partially. The strip-shaped emitter regions are arranged with their longitudinal axis in parallel to each other. The width of each strip-shaped emitter region 3 in a lateral direction parallel to the first main side and vertical to the longitudinal axis of the emitter region 3 is exemplarily in a range from 0.1 µm to 100 µm, exemplarily in a range from 0.1 µm to 20 µm, or exemplarily in a range from 0.1 µm to 10 µm. The distance between adjacent emitter regions 3 is exemplarily in a range from 1 µm to 50 µm, exemplarily in a range from 1 µm to 20 µm, or exemplarily in a range from 1 µm to 10 µm. Exemplarily, the peak net doping concentration of the p-type emitter regions 3 is in a range from $1 \cdot 10^{16}$ cm$^{-3}$ to $1\ 10^{21}$ cm$^{-3}$, exemplarily in a range from $1 \cdot 10^{17}$ cm$^{-3}$ to $5 \cdot 10^{20}$ cm$^{-3}$, or exemplarily in a range from $5 \cdot 10^{17}$ cm$^{-3}$ to $1 \cdot 10^{20}$ cm$^{-3}$.

The first main side 4 of the JBS rectifier, which is the anode side of the device, is covered with a first metal contact layer 5 that forms a Schottky barrier in places where the first metal contact layer 5 contacts the n-type drift layer 22A, 22B and that forms an ohmic contact with the p-type emitter regions 3 in places where the first metal contact layer 5 contacts the p-type emitter regions 3. The second drift layer 22B section can be grown epitaxially on a highly doped n-type SiC substrate wafer used as the substrate layer 1.

In the first comparative example the emitter regions 3 are surrounded by the first drift layer section 22A so that all sides of the emitter regions 3 except the side, which is in contact with the first metal contact layer 5, are covered by the first drift layer section 22A. In other words the second drift layer section 22B is separated from the emitter regions 3 by the first drift layer section 22A. For each emitter region 3 the first drift layer section 22A includes a layer section which is in contact with the respective emitter region to form a pn-junction between the first drift layer section 22A and the respective emitter region 3, wherein the thickness of this layer section in a direction perpendicular to the interface between the first drift layer section 22A and the respective emitter region 3 is at least 0.1 µm. That means that each emitter region 3 is covered with a layer of the first drift layer section 22A with a thickness of at least 0.1 µm, exemplarily at least 0.2 µm or exemplarily at least 0.5 µm.

The drift layer thickness in a direction from the first main side 4 to the second main side 7 opposite to the first main side 4, of the JBS rectifier is exemplarily in a range from 5 µm to 500 µm, exemplarily in a range from 5 µm to 100 µm, or exemplarily in a range from 5 µm to 40 µm. The depth of the emitter regions 3, to which the emitter regions 3 extend from the interface with the first metal contact layer 5 in a direction from the first main side 4 towards the second main side 7 is exemplarily in a range from 0.1 µm to 20 µm, exemplarily in a range from 0.1 µm to 3 µm, or exemplarily in a range from 0.1 µm to 1 µm.

In all comparative examples and in the embodiment of the claimed invention the depth of the emitter regions 3 is less than the thickness of the drift layer 22A, 22B. That means the emitter regions are always separated from the substrate layer 1 at least by the second drift layer section 22B.

On the second main side 7 of the JBS rectifier opposite to the first main side 4, a second metal contact layer 6 is formed on the substrate layer 1 to form an ohmic contact to the substrate layer 1.

Figure 3:
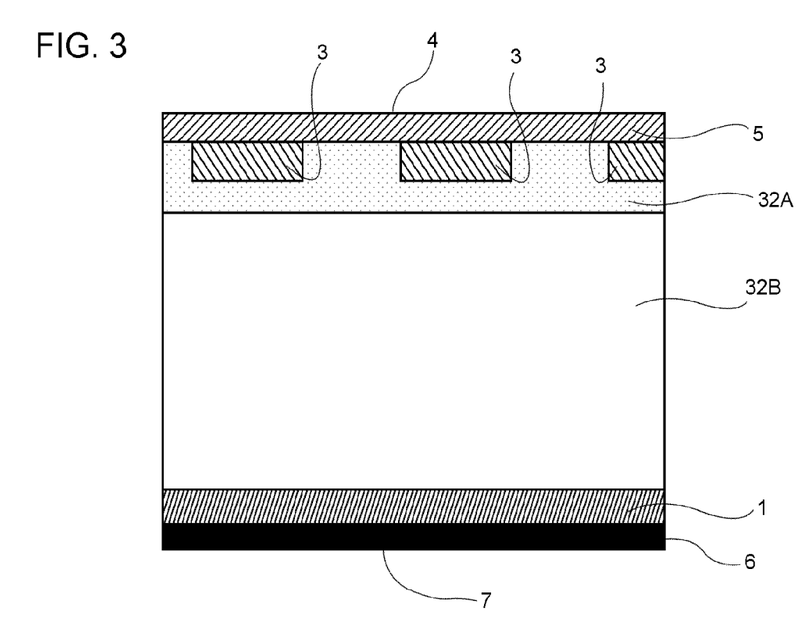
FIG. 3 shows a partial cross-sectional view of a JBS rectifier according to a second comparative example.

A JBS rectifier according to a second comparative example is shown in FIG. 3. In view of the many similarities with the first comparative example only the differences to the first comparative example are described in the following. While in the first comparative example described above the portions of the first drift layer section 22A which surround the emitter sections 3 are not connected with each other, the first drift layer section 32A in the second comparative example forms a continuous layer separating the second drift layer section 32B from the first metal contact layer 5. That means that in the second comparative example the Schottky contact is only formed between the first drift layer section 32A and the first metal contact layer 5 but not between the second drift layer section 32B and the first metal contact layer 5. In this second comparative example, the width of the depletion zone of the pn-junction between the drift layer and the emitter region for a given reverse bias is increased in a region adjacent to the Schottky contact due to the lower net doping concentration in this region. Accordingly, the Schottky contact can be more effectively protected from a high electric field peak. This allows to reduce the leakage current.

In FIGS. 5 to 10 there are shown current voltage characteristics of different JBS rectifiers according to the first and second comparative example as well as of the above described common JBS rectifier under forward bias conditions. In these Figures the term "conventional drift layer" relates to a common JBS rectifier as described above with FIG. 1, which has a drift layer with a constant net doping concentration. The term "compensated p-emitter" relates to a JBS rectifier according to the first comparative example and the term "two-section drift layer" relates to the JBS rectifier according to the second comparative example. In FIGS. 5 and 6 there are shown the current voltage characteristics of JBS rectifiers having a peak net doping concentration of the emitter regions 3 of $2 \cdot 10^{18}$ cm$^{-3}$, respectively. In FIGS. 7 and 8 there are shown the current voltage characteristics of JBS rectifiers having a peak net doping concentration of $2 \cdot 10^{19}$ cm$^{-3}$ and in FIGS. 9 and 10 there are shown the current voltage characteristics of JBS rectifiers having a peak net doping concentration of $2 \cdot 10^{20}$ cm$^{-3}$. FIGS. 5, 7 and 9 show the current voltage characteristics of JBS rectifiers having a width of the emitter regions of 6 µm and FIGS. 6, 8 and 10 show the current voltage characteristics of JBS rectifiers having a width of the emitter regions of 14 µm.

As can be seen from FIGS. 5 to 10 the current voltage characteristics show a change of the differential resistance at the transition from of unipolar conduction mode to bipolar conduction mode. In particular the common JBS rectifier referenced as "conventional drift layer" in FIGS. 5 to 10 exhibits a pronounced snap-back phenomenon with a negative differential resistance at the transition from unipolar conduction mode to bipolar conduction mode. The JBS rectifier according to the first comparative example referenced as "compensated p-emitter" and the JBS rectifier according to the second comparative example referenced as "two-section drift layer" do not show the snap-back phenomenon with a negative differential resistance or show at least a much weaker snap-back phenomenon compared to the common JBS rectifier. Moreover, the forward bias at which the transition from the unipolar to the bipolar conduction mode can be observed is lower for the JBS rectifier according to the first and second comparative example compared with the common JBS rectifier. Accordingly, the JBS rectifiers according to the first and second comparative examples have a higher capability to handle surge current situations because the power loss during surge current operation is highest for the common JBS rectifier as is obvious from FIGS. 5 to 10. It is further observed that more highly doped p-regions (FIGS. 9 and 10) tend to generate stronger snap-back characteristics than the JBS rectifiers with weaker p-emitters (FIGS. 5 and 6). Regarding to endurance of JBS rectifiers under surge current conditions, one would prefer those geometries which offer minimal or no current snap-back as well as a transition to the bipolar conduction mode at a forward bias as low as possible. The JBS rectifiers according to the first and second comparative example can achieve this goal with moderately to weakly doped emitter regions.

Figure 4:
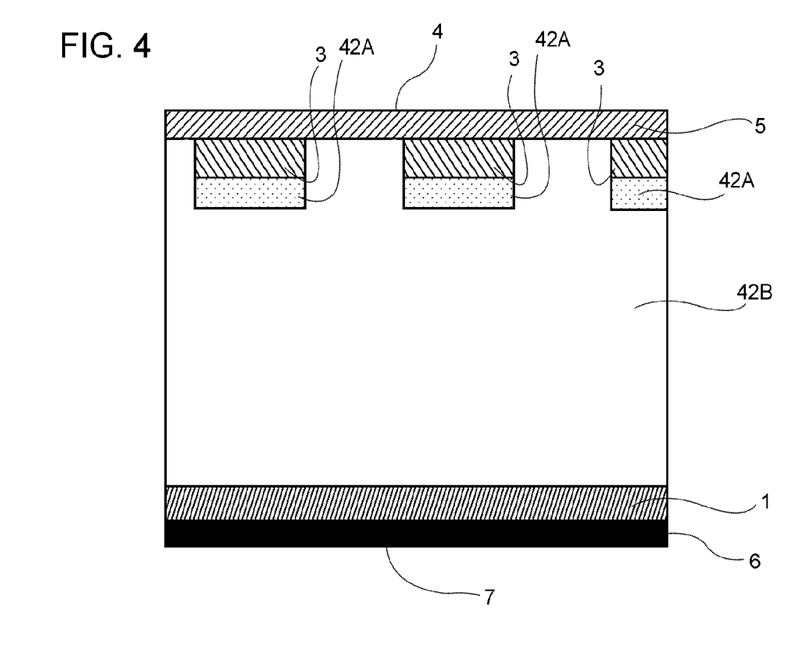
FIG. 4 shows a partial cross-sectional view of a JBS rectifier according to a third comparative example.

A JBS rectifier according to a third comparative example is shown in FIG. 4. In view of the many similarities with the first comparative example again only the differences to the first comparative example are described in the following. In contrast to the first comparative example, the first drift layer section 42A is in direct contact with and covers a lower side of the emitter regions 3 opposite to the first main side 4 of the JBS rectifier only. The lateral sides of the emitter regions are in direct contact with and covered by the second drift layer region 42B. Throughout this specification the term "lateral" relates to the position in a lateral direction which is a direction parallel to the first main side 4.

Figure 11:
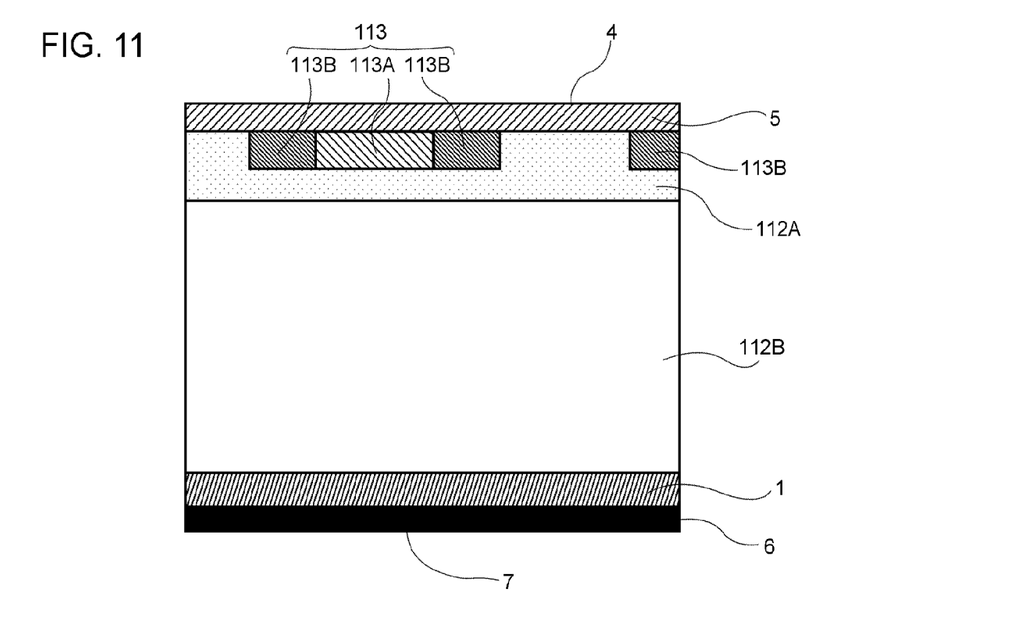
FIG. 11 shows a partial cross-sectional view of a JBS rectifier according to a fourth comparative example.

A JBS rectifier according to a fourth comparative example is shown in FIG. 11. In view of the many similarities with the second comparative example only the differences to the second comparative example are described in the following. The JBS rectifier according to the fourth comparative example differs from the JBS rectifier according to the second comparative example in that each p-type emitter region 113 comprises a first emitter section 113A and a second emitter section 113B, wherein a peak net doping concentration of the second emitter region 113B is at least two times higher than a peak net doping concentration of the first emitter section 113A. The boundary between the first emitter section 113A and the second emitter section 113B is determined in that the net doping concentration at the boundary is in the middle between the peak net doping concentration of the first emitter section 113A and the peak net doping concentration of the second emitter section 113B. The peak net doping concentration of the second emitter section is exemplarily in a range from $1 \cdot 10^{17}$ cm$^{-3}$ to $1 \cdot 10^{21}$ cm$^{-3}$, exemplarily in a range from $1 \cdot 10^{18}$ cm$^{-3}$ to $1 \cdot 10^{21}$ cm$^{-3}$, or exemplarily in a range from $1 \cdot 10^{19}$ cm$^{-3}$ to $1 \cdot 10^{21}$ cm$^{-3}$. The width of the second emitter sections 113B in a lateral direction vertical to the longitudinal axis of the strip-shaped emitter regions 113 is exemplarily in a range from 0.1 µm to 10 µm, exemplarily in a range from 0.1 µm to 3 µm, or exemplarily in a range from 0.1 µm to 1 µm.

In the fourth comparative example a lateral side of the first emitter section 113A in each emitter region 113 is covered by the second emitter section 113B. Exemplarily, the second emitter sections 113B extend to the same depth as the first emitter sections 113A. Also, exemplarily the first and second emitter sections 113A, 113B of all emitter sections 113 extend all to the same depth. The depth of the second emitter sections 113B is exemplarily in a range from 0.1 µm to 20 µm, exemplarily in a range from 0.1 µm to 3 µm, or exemplarily in a range from 0.1 µm to 1 µm. The first drift layer section 112A is in contact with both, the first emitter section 113A and the second emitter section 113B, whereas the second drift layer section 112B is separated from the emitter region 113 by the first drift layer section 112A. With the JBS rectifier according to the fourth comparative example the blocking characteristics can be improved without impairing the on-state characteristics including the surge current regime. In particular, the breakdown voltage can be increased and the leakage current can be decreased.

Figure 12:
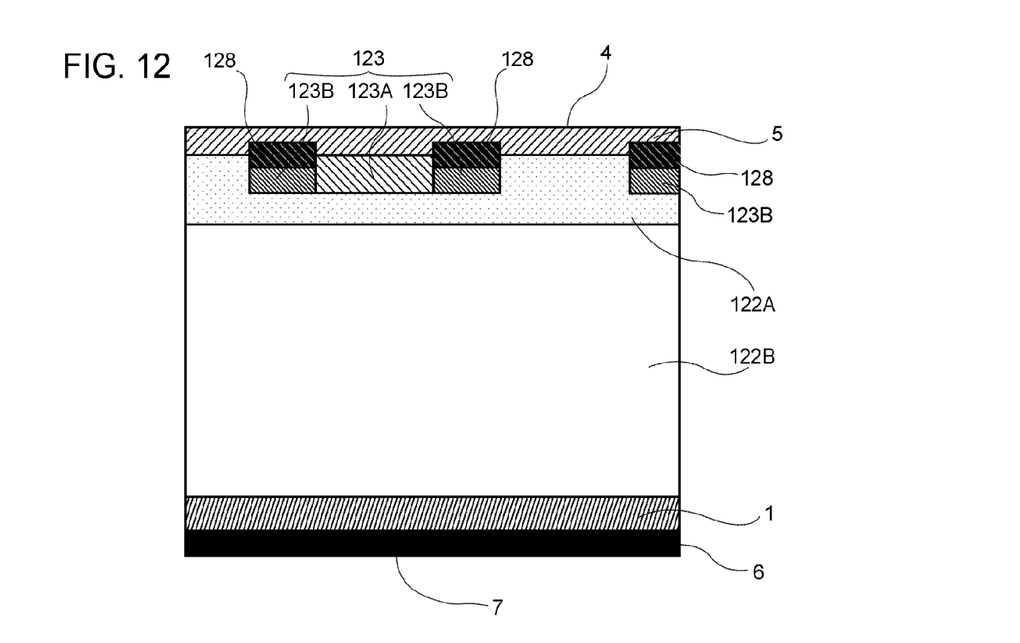
FIG. 12 shows a partial cross-sectional view of a JBS rectifier according to a fifth comparative example.

A JBS rectifier according to a fifth comparative example is shown in FIG. 12. In view of the many similarities with the fourth comparative example only the differences to the fourth comparative example are described in the following. The fifth comparative example differs from the fourth comparative example only in that the second emitter section 123B is covered by an oxide layer 128 to be separated from the first metal contact layer 5 by the oxide layer 128. The first emitter section 123A is not covered by the oxide layer 128 and contacts the first metal contact layer 5. The remaining features of the fifth comparative example are identical to that of the fourth comparative example. In particular, the first drift layer section 122A in FIG. 12 corresponds to the first drift layer section 112A in FIG. 11 and the second drift layer section 122B in FIG. 12 corresponds to the second drift layer section 112B in FIG. 11.

Figure 13:
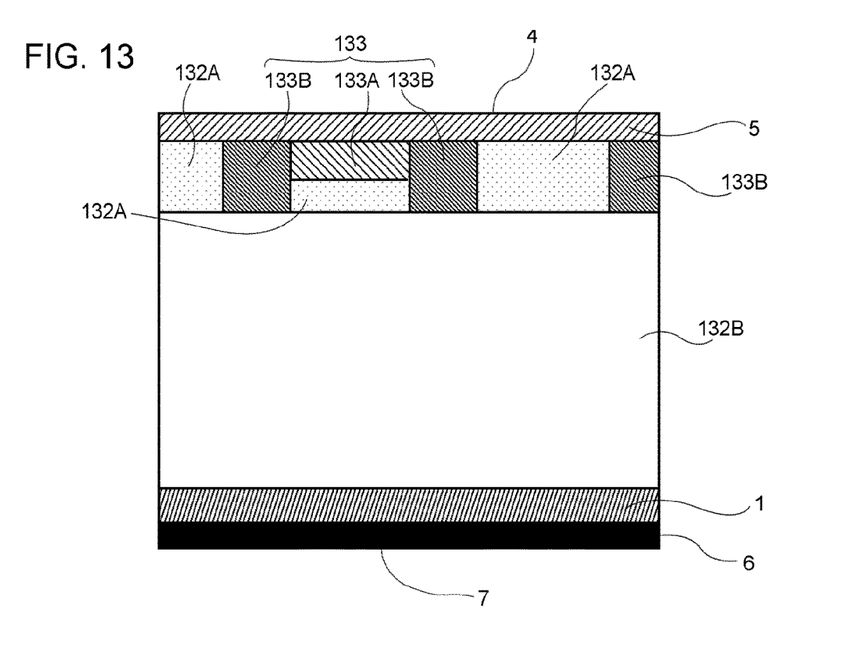
FIG. 13 shows a partial cross-sectional view of a JBS rectifier according to an embodiment of the claimed invention.

An embodiment of the JBS rectifier of the claimed invention is shown in FIG. 13. In view of the many similarities with the fourth comparative example only the differences to the fourth comparative example are described in the following. The JBS rectifier according to the embodiment differs from the JBS rectifier according to the fourth comparative example only in that the second emitter section 133B of the emitter region 133 extends to the second drift layer section 132B whereas the first emitter section 133A is separated from the second drift layer section 132B by the first drift layer section 132A. In this embodiment the Schottky contact is protected particularly effectively from a high electric field peak under reverse bias conditions.

Figure 14:
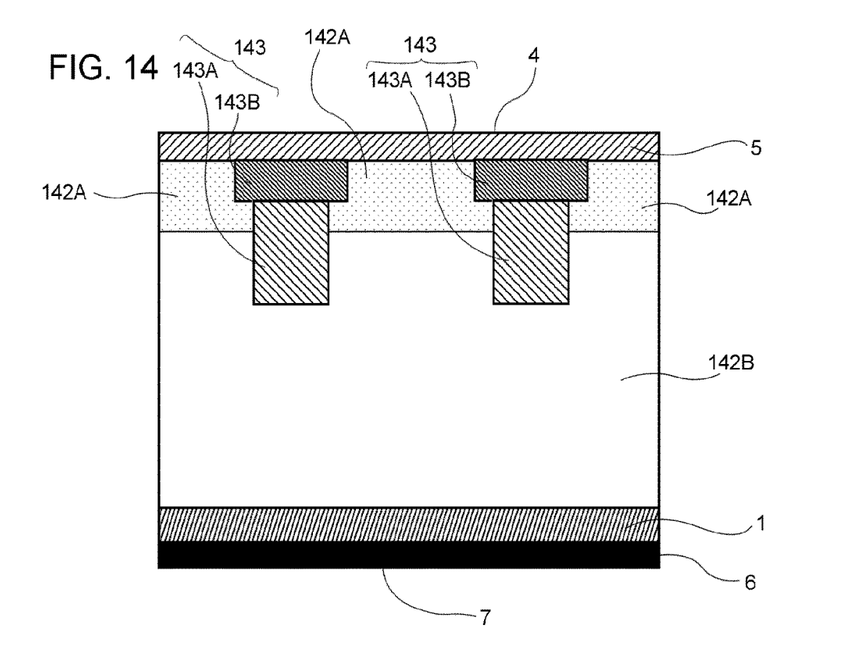
FIG. 14 shows a partial cross-sectional view of a JBS rectifier according to a sixth comparative example.

A JBS rectifier according to a sixth comparative example is shown in FIG. 14. In view of the many similarities with the embodiment of the claimed invention only the differences to the embodiment shown in FIG. 13 are described in the following. In the JBS rectifier according to the sixth comparative example only the second emitter section 143B of each emitter region 143 is in contact with the first metal contact layer while the first emitter section 143A extends from a lower side of the second emitter section 143B, which is a side of the second emitter section 143B towards the second main side 7, to the second drift layer section 142B. The second emitter section 143B is separated from the second drift layer section 142B by the first drift layer section 142A. This comparative example can attain a lower on-state resistance due to a lower area required for the emitter regions 143.

Figure 15:
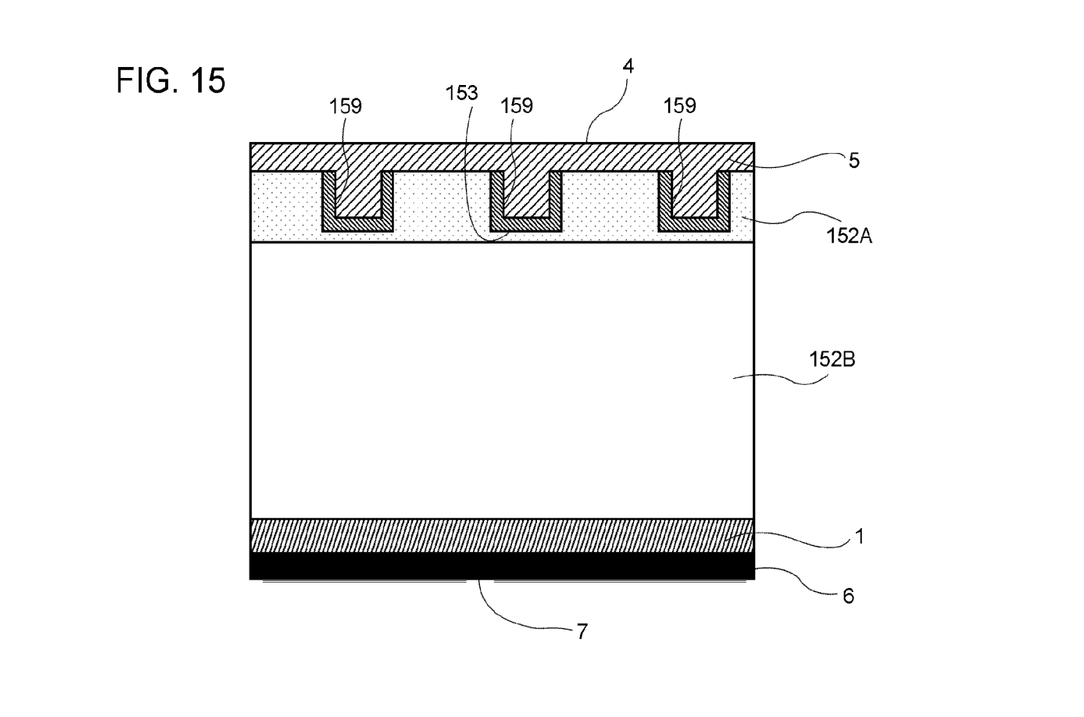
FIG. 15 shows a partial cross-sectional view of a JBS rectifier according to a seventh comparative example.

A JBS rectifier according to a seventh comparative example is shown in FIG. 15. In view of the many similarities with the second comparative example only the differences to the second comparative example are described in the following. The JBS rectifier according to the seventh comparative example differs from the JBS rectifier according to the second comparative example in that in the JBS rectifier according to the seventh comparative example, a groove 159 is formed in each emitter region 153 along the longitudinal axis of the strip-shaped emitter regions 153. The first metal contact layer 5 extends into these grooves 159 formed in the emitter regions 153. The remaining features of the seventh comparative example are identical to that of the second comparative example. In particular, the first drift layer section 152A in FIG. 15 corresponds to the first drift layer section 32A in FIG. 3 and the second drift layer section 152B in FIG. 15 corresponds to the second drift layer section 32B in FIG. 3. In this comparative example the emitter characteristics can be improved.

Figure 16:
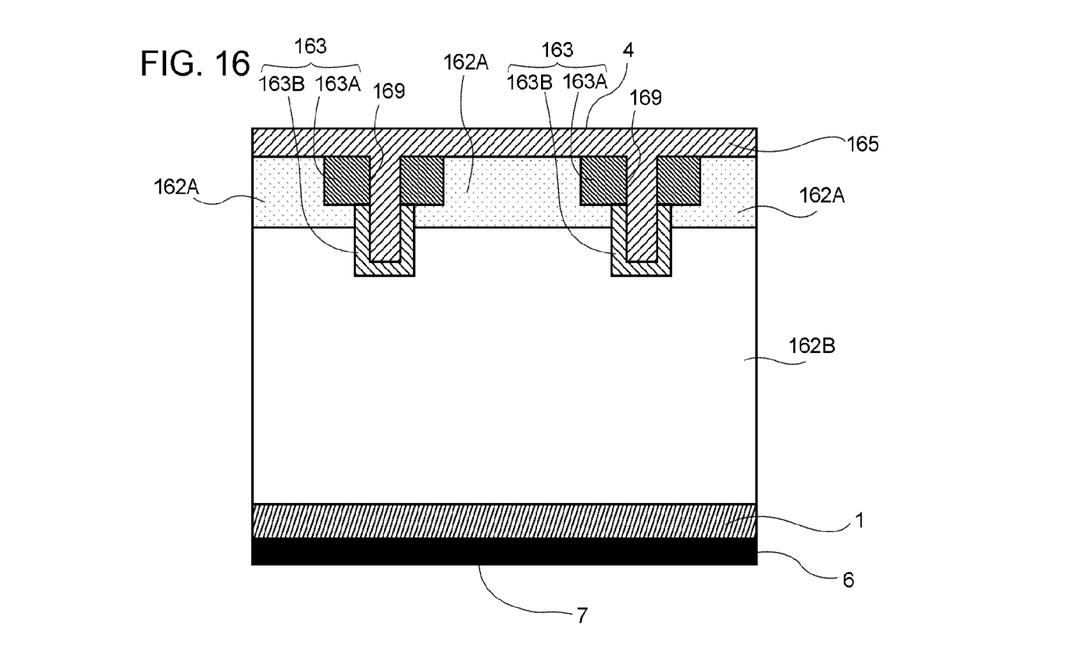
FIG. 16 shows a partial cross-sectional view of a JBS rectifier according to an eighth comparative example.

A JBS rectifier according to an eighth comparative example is shown in FIG. 16. In view of the many similarities with the sixth comparative example only the differences to the sixth comparative example are described in the following. The JBS rectifier according to the eighth comparative example differs from the JBS rectifier according to the sixth comparative example in that in the JBS rectifier according to the eighth comparative example, a groove 169 is formed in each emitter region 163 along the longitudinal axis of the strip-shaped emitter regions 163. In each emitter region 163 the groove 169 extends from the first main side 4 through the first emitter section 163A to the second emitter section 163B. The first metal contact layer 5 extends into these grooves 169 formed to contact the first emitter section 163A and the second emitter section 163B. The remaining features of the eighth comparative example are identical to that of the sixth comparative example. In particular, the first drift layer section 162A in FIG. 16 corresponds to the first drift layer section 142A in FIG. 14 and the second drift layer section 162B in FIG. 16 corresponds to the second drift layer section 142B in FIG. 14. As in the seventh comparative example described above, in the eighth comparative example the emitter characteristics can be improved compared to the sixth comparative example.

It will be apparent for persons skilled in the art that modifications of the above described embodiment are possible without departing from the idea of the invention as defined by the appended claims.

In the above described embodiment and comparative examples it was described to cover specific surfaces of the emitter regions with the first drift layer section. However, other portions of the surfaces of the emitter regions except the surface, which forms the contact with the first metal contact layer, can be covered with the first drift layer section. Exemplarily, at least 50% of the surface area of surfaces of the each emitter region except the surface, which forms the contact with the first metal contact layer, is covered with the lower doped first drift layer section.

In the above described embodiment and comparative examples the step-like boundary between the first and second drift layer section was defined by steep gradient of the net doping concentration. In an exemplary embodiment the first drift layer section 22A and the second drift layer section 22B are formed by epitaxy and the step-like transition from the peak net doping concentration of the first drift layer section 22A is a transition obtained by a sudden change of growth conditions.

In the above described embodiment and comparative examples, the substrate layer, the drift layer and the emitter regions are all formed of silicon carbide. While this is an exemplary embodiment, these layers could also be formed of other semiconductor materials such as silicon.

In the above described embodiment and comparative examples the emitter regions were described to be strip-shaped regions, which are arranged in parallel. However the emitter regions may also have other shapes and form other patterns such as hexagonal shapes of the emitter regions arranged in a two-dimensional honeycomb pattern or any other island-like shape arranged in any other two-dimensional pattern. The emitter regions may also be connected with each other and arranged in the pattern of a grid.

The above embodiment and comparative examples were explained with specific conductivity types. The conductivity types of the semiconductor layers in the above described embodiments might be switched, so that all layers which were described as p-type layers would be n-type layers and all layers which were described as n-type layers would be p-type layers.

It should be noted that the term "comprising" does not exclude other elements or steps and that the indefinite article "a" or "an" does not exclude the plural. Also elements described in association with different embodiments may be combined.

What is claimed is:

1. A junction barrier Schottky rectifier comprising:
a substrate layer having a first conductivity type;
a drift layer having the first conductivity type, wherein the drift layer is on the substrate layer and has a lower peak net doping concentration than the substrate layer;
a plurality of emitter regions in the drift layer adjacent to a first main side of the junction barrier Schottky rectifier, each emitter region having a second conductivity type different from the first conductivity type;
a first metal contact layer forming a Schottky contact with the drift layer and an ohmic contact with each one of the emitter regions on the first main side of the junction barrier Schottky rectifier; and
a second metal contact layer forming an ohmic contact with the substrate layer on a second main side of the junction barrier Schottky rectifier opposite to the first main side,
wherein the drift layer includes a first drift layer section and a second drift layer section, wherein a peak net doping concentration of the first drift layer section is at least two times lower than a minimum net doping concentration of the second drift layer section, and
for each emitter region the first drift layer section includes a layer section which is in contact with the respective emitter region to form a pn-junction between the first drift layer section and the respective emitter region, wherein the thickness of this layer section in a direction perpendicular to the interface between the first drift layer section and the respective emitter region is at least 0.1 µm, wherein
each one of the emitter regions comprises a first emitter section and a second emitter section, wherein a peak net doping concentration of the second emitter region is at least two times higher than a peak net doping concentration of the first emitter section, and
in each emitter region the second emitter section extends to the second drift layer section, while the first emitter section is separated from the second drift layer section by the first drift layer section.

2. The junction barrier Schottky rectifier according to claim 1, wherein the first drift layer section forms the Schottky contact with the first metal contact layer and separates the first metal contact layer from the second drift layer section.

3. The junction barrier Schottky rectifier according to claim 1, wherein the first metal contact layer extends into a groove or hole formed in each one of the emitter regions.

4. The junction barrier Schottky rectifier according to claim 1, wherein a lateral side of the first emitter section in each emitter region is covered by the second emitter section.

5. The junction barrier Schottky rectifier according to claim 4, wherein in each emitter region the second emitter section is separated from the first metal contact layer by an oxide layer formed on the second emitter section.

6. The junction barrier Schottky rectifier according to claim 1, wherein the net doping concentration in the drift layer is $1 \cdot 10^{17}$ cm$^{-3}$ or less, or $5 \cdot 10^{16}$ cm$^{-3}$ or less, or $1 \cdot 10^{16}$ cm$^{-3}$ or less.

7. The junction barrier Schottky rectifier according to claim 1, wherein the net doping concentration increases from the net doping concentration in the first drift layer section to the net doping concentration in the second drift layer section in a thin transition region connecting the first drift layer section and the second drift layer section with a steep gradient of at least $20 \cdot n_{max}(1)/\mu m$, or of at least $40 \cdot n_{max}(1)/\mu m$, wherein $n_{max}(1)$ is the peak doping concentration in the first drift layer section.

8. The junction barrier Schottky rectifier according to claim 1, the depth of the drift layer from the interface with the first metal contact layer in a direction from the first main side towards the second main side of the Junction barrier Schottky rectifier is in a range between 5 µm and 500 µm, or in a range between 5 µm and 100 µm, or in a range between 5 µm and 40 µm.

9. The junction barrier Schottky rectifier according to claim 1, wherein the peak net doping concentration in the first drift layer section is $1 \cdot 10^{16}$ cm$^{-3}$ or below, or $5 \cdot 10^{15}$ cm$^{-3}$ or below, or $1 \cdot 10^{15}$ cm$^{-3}$ or below.

10. The junction barrier Schottky rectifier according to claim 1, wherein the net doping concentration in the first drift layer section and in the second drift layer section is substantially constant, respectively, and the doping concentration profile at the boundary between the first drift layer section and the second drift layer section is step-like.

11. The junction barrier Schottky rectifier according to claim 2, wherein the first metal contact layer extends into a groove or hole formed in each one of the emitter regions.

12. The junction barrier Schottky rectifier according to claim 2, wherein a lateral side of the first emitter section in each emitter region is covered by the second emitter section.

13. The junction barrier Schottky rectifier according to claim 12, wherein in each emitter region the second emitter section is separated from the first metal contact layer by an oxide layer formed on the second emitter section.

14. The junction barrier Schottky rectifier according to claim 2, wherein the net doping concentration in the drift layer is $1 \cdot 10^{17}$ cm$^{-3}$ or less, or $5 \cdot 10^{16}$ cm$^{-3}$ or less, or $1 \cdot 10^{16}$ cm$^{-3}$ or less.

15. The junction barrier Schottky rectifier according to claim 2, wherein the net doping concentration increases from the net doping concentration in the first drift layer section to the net doping concentration in the second drift layer section in a thin transition region connecting the first drift layer section and the second drift layer section with a steep gradient of at least $20 \cdot n_{max}(1)/\mu m$, or of at least $40 \cdot n_{max}(1)/\mu m$, wherein $n_{max}(1)$ is the peak doping concentration in the first drift layer section.

16. The junction barrier Schottky rectifier according to claim 2, the depth of the drift layer from the interface with the first metal contact layer in a direction from the first main side towards the second main side of the Junction barrier Schottky rectifier is in a range between 5 μm and 500 μm, or in a range between 5 μm and 100 μm, or in a range between 5 μm and 40 μm.

17. The junction barrier Schottky rectifier according to claim 2, wherein the peak net doping concentration in the first drift layer section is $1 \cdot 10^{16}$ cm$^{-3}$ or below, or $5 \cdot 10^{15}$ cm$^{-3}$ or below, or $1 \cdot 10^{15}$ cm$^{-3}$ or below.

18. The junction barrier Schottky rectifier according to claim 2, wherein the net doping concentration in the first drift layer section and in the second drift layer section is substantially constant, respectively, and the doping concentration profile at the boundary between the first drift layer section and the second drift layer section is step-like.

* * * * *